United States Patent
Ohashi et al.

(10) Patent No.: US 7,867,472 B2
(45) Date of Patent: Jan. 11, 2011

(54) INSULATING TARGET MATERIAL, METHOD OF MANUFACTURING INSULATING TARGET MATERIAL, CONDUCTIVE COMPLEX OXIDE FILM, AND DEVICE

(75) Inventors: Koji Ohashi, Chino (JP); Takeshi Kijima, Matsumoto (JP); Setsuya Iwashita, Nirasaki (JP)

(73) Assignee: Seiko Epson Corporation (JP)

( * ) Notice: Subject to any disclaimer, the term of this patent is extended or adjusted under 35 U.S.C. 154(b) by 1017 days.

(21) Appl. No.: 11/655,957

(22) Filed: Jan. 19, 2007

(65) Prior Publication Data
US 2007/0170053 A1 Jul. 26, 2007

(30) Foreign Application Priority Data
Jan. 20, 2006 (JP) ............................. 2006-012631

(51) Int. Cl.
*C23C 14/00* (2006.01)

(52) U.S. Cl. .............. 423/594.8; 423/594.2; 423/594.4; 423/594.6; 423/594.9; 423/594.16; 423/263; 423/326; 423/595; 423/596; 423/598; 423/599; 501/103; 501/126; 501/134

(58) Field of Classification Search ................. 423/263, 423/326, 594.2–594.16, 598, 599, 595, 596; 501/103, 126, 134
See application file for complete search history.

(56) References Cited

U.S. PATENT DOCUMENTS 7,524,451 B2 * 4/2009 Ohashi et al. ............... 264/658
2006/0120940 A1 * 6/2006 Natori et al. ................. 423/326
2007/0040243 A1 2/2007 Ohashi et al.
2007/0045109 A1 * 3/2007 Kijima et al. ........... 204/298.13
2007/0163879 A1 * 7/2007 Ohashi et al. ........... 204/298.13

FOREIGN PATENT DOCUMENTS

| EP | 1594142 | 11/2005 |
|---|---|---|
| JP | 05-105430 | 4/1993 |
| JP | 05-105446 | 4/1993 |
| JP | A-10-176264 | 6/1998 |
| JP | 11-053935 | 2/1999 |
| JP | 2003-063860 | 3/2003 |
| JP | 2004-076021 | 3/2004 |

OTHER PUBLICATIONS

"Fabrication and Electric Properties of LaCoO3 Thin Films by Ion-Beam Sputtering", Hattori, T. et al., Thin Solid Films, Elsevier-Sequoia S.A. Lausanne, CH., vol. 388, No. 1-2, June 1, 2001, pp. 183-188, XP004234768.

* cited by examiner

*Primary Examiner*—Steven Bos
(74) *Attorney, Agent, or Firm*—Harness, Dickey & Pierce, P.L.C.

(57) ABSTRACT

An insulating target material for obtaining a conductive complex oxide film represented by a general formula $ABO_3$. The insulating target material includes: an oxide of an element A; an oxide of an element B; an oxide of an element X; and at least one of an Si compound and a Ge compound, the element A being at least one element selected from La, Ca, Sr, Mn, Ba, and Re, the element B being at least one element selected from Ti, V, Sr, Cr, Fe, Co, Ni, Cu, Ru, Ir, Pb, and Nd, and the element X being at least one element selected from Nb, Ta, and V.

5 Claims, 11 Drawing Sheets

INSULATING TARGET MATERIAL, METHOD OF MANUFACTURING INSULATING TARGET MATERIAL, CONDUCTIVE COMPLEX OXIDE FILM, AND DEVICE

Japanese Patent Application No. 2006-12631, filed on Jan. 20, 2006, is hereby incorporated by reference in its entirety.

BACKGROUND OF THE INVENTION

The present invention relates to an insulating target material suitably used for radio frequency (RF) sputtering, a method of manufacturing an insulating target material, a conductive complex oxide film, and a device.

A target for forming a complex oxide film by sputtering is generally obtained as follows. For example, a target for forming a perovskite oxide film of the general formula $ABO_3$ is obtained by pulverizing oxide raw materials of the element A and the element B, mixing the oxide raw materials taking the stoichiometric composition into consideration, and sintering the mixture. A material disclosed in JP-A-10-176264 has been known as such a target, for example. This document discloses a sputtering target for a perovskite oxide of the chemical formula $ABO_3$ which has a specific relative density and size.

On the other hand, when producing a target for forming a conductive complex oxide film of the general formula $ABO_3$, the inventor of the invention has found that a satisfactory target cannot be obtained merely by pulverizing oxide raw materials of the element A and the element B and mixing and sintering the oxide raw materials at a specific composition.

For example, when producing a target for forming an $LaNiO_3$ conductive complex oxide film by RF sputtering using a known sintering method, the following findings were obtained. Specifically, a target obtained by mixing an La oxide powder and an Ni oxide powder at a composition ratio of 1:1 and sintering the mixture did not exhibit uniform insulating properties over the entire target, in which a portion exhibiting low insulating properties (i.e. portion exhibiting conductivity higher than that of the surrounding portion) was formed. When RF sputtering is performed using such a target, plasma is concentrated on the portion exhibiting low insulating properties, whereby the portion on which the plasma is concentrated may be dissolved or cracks may occur in the target due to plasma concentration. This makes it difficult to use such a target for RF sputtering.

SUMMARY

According to a first aspect of the invention, there is provided an insulating target material for obtaining a conductive complex oxide film represented by a general formula $ABO_3$, the insulating target material comprising:
  an oxide of an element A;
  an oxide of an element B;
  an oxide of an element X; and
  at least one of an Si compound and a Ge compound,
  the element A being at least one element selected from La, Ca, Sr, Mn, Ba, and Re,
  the element B being at least one element selected from Ti, V, Sr, Cr, Fe, Co, Ni, Cu, Ru, Ir, Pb, and Nd, and
  the element X being at least one element selected from Nb, Ta, and V.

According to a second aspect of the invention, there is provided a method of manufacturing an insulating target material for obtaining a conductive complex oxide film represented by a general formula $ABO_3$, the method comprising:

heat-treating and pulverizing a mixture obtained by mixing an oxide of an element A, an oxide of an element B, and an oxide of an element X to obtain a first powder, the element A being at least one element selected from La, Ca, Sr, Mn, Ba, and Re, the element B being at least one element selected from Ti, V, Sr, Cr, Fe, Co, Ni, Cu, Ru, Ir, Pb, and Nd, and the element X being at least one element selected from Nb, Ta, and V;

mixing the first powder and a solution including at least one of an Si raw material and a Ge raw material, and obtaining a second powder from the mixture of the first powder and the solution;

heat-treating and pulverizing the second powder to obtain a third powder; and heat-treating the third powder.

According to a third aspect of the invention, there is provided a conductive complex oxide film represented by a general formula $ABO_3$, comprising:
  an element A;
  an element B;
  at least one element selected from Nb, Ta, and V; and
  at least one of Si and Ge,
  the conductive complex oxide film being formed by RF sputtering by using the above-described insulating target material.

According to a fourth aspect of the invention, there is provided a device comprising:
  a base; and
  the above-described conductive complex oxide film formed above the base.

DETAILED DESCRIPTION OF THE EMBODIMENT

Figure 1:
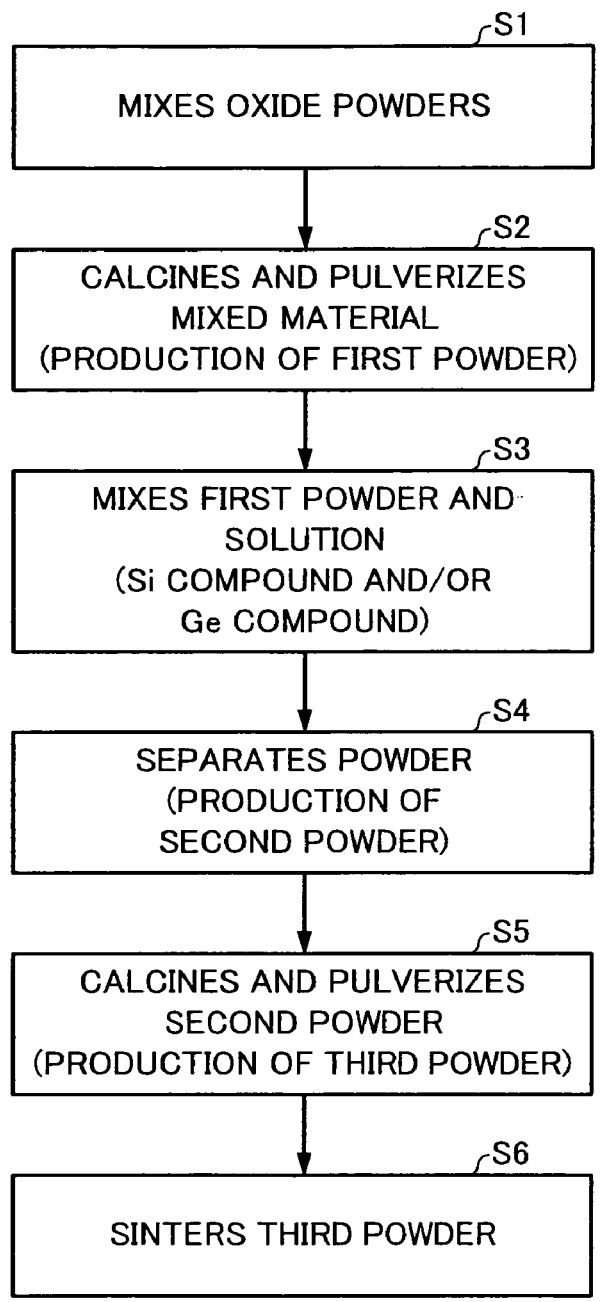
FIG. 1 is a flowchart showing a method of manufacturing an insulating target material according to one embodiment of the invention.

The invention may provide an insulating target material for obtaining a conductive complex oxide film which is uniform and exhibits excellent insulating properties and excellent characteristics.

The invention may also provide a method of manufacturing the above insulating target material.

The invention may also provide a conductive complex oxide film formed by using the above insulating target material.

The invention may also provide a device comprising the above conductive complex oxide film.

According to one embodiment of the invention, there is provided an insulating target material for obtaining a conductive complex oxide film represented by a general formula $ABO_3$, the insulating target material comprising:
an oxide of an element A;
an oxide of an element B;
an oxide of an element X; and
at least one of an Si compound and a Ge compound,
the element A being at least one element selected from La, Ca, Sr, Mn, Ba, and Re,
the element B being at least one element selected from Ti, V, Sr, Cr, Fe, Co, Ni, Cu, Ru, Ir, Pb, and Nd, and
the element X being at least one element selected from Nb, Ta, and V.

The insulating target material according to this embodiment may be suitably used for RF sputtering due to its uniformity and excellent insulating properties. A conductive complex oxide film which exhibits an excellent crystal orientation and an excellent surface morphology can be obtained by using the insulating target material according to this embodiment.

In the insulating target material according to this embodiment, the Si compound and the Ge compound may be oxides.

In the insulating target material according to this embodiment, the element A may be La, and the element B may be Ni.

In the insulating target material according to this embodiment, the element X may be Nb.

According to one embodiment of the invention, there is provided a method of manufacturing an insulating target material for obtaining a conductive complex oxide film represented by a general formula $ABO_3$, the method comprising:
heat-treating and pulverizing a mixture obtained by mixing an oxide of an element A, an oxide of an element B, and an oxide of an element X to obtain a first powder, the element A being at least one element selected from La, Ca, Sr, Mn, Ba, and Re, the element B being at least one element selected from Ti, V, Sr, Cr, Fe, Co, Ni, Cu, Ru, Ir, Pb, and Nd, and the element X being at least one element selected from Nb, Ta, and V;
mixing the first powder and a solution including at least one of an Si raw material and a Ge raw material, and obtaining a second powder from the mixture of the first powder and the solution;
heat-treating and pulverizing the second powder to obtain a third powder; and
heat-treating the third powder.

An insulating target material which is uniform and exhibits excellent insulating properties can be obtained by using the manufacturing method according to this embodiment.

In the method of manufacturing an insulating target material according to this embodiment, the solution may include at least one of the Si raw material and the Ge raw material in an amount of 2 to 10 mol %.

In the method of manufacturing an insulating target material according to this embodiment, the heat treatment of the mixture may be performed at 900 to 1000° C.

In the method of manufacturing an insulating target material according to this embodiment, the heat treatment of the second powder may be performed at 900 to 1000° C.

In the method of manufacturing an insulating target material according to this embodiment, the heat treatment of the third powder may be performed at 1000 to 1500° C.

According to one embodiment of the invention, there is provided a conductive complex oxide film represented by a general formula $ABO_3$, comprising:
an element A;
an element B;
at least one element selected from Nb, Ta, and V; and
at least one of Si and Ge,
the conductive complex oxide film being formed by RF sputtering using the above-described insulating target material.

According to one embodiment of the invention, there is provided a device comprising:
a base; and
the above-described conductive complex oxide film formed above the base.

The device according to this embodiment refers to a device comprising the above conductive complex oxide film, and includes a part comprising the conductive complex oxide film and an electronic instrument comprising the part. Specific examples of the device are described later.

Embodiments of the invention are described below in detail.

1. Insulating Target Material

An insulating target material according to one embodiment of the invention is an insulating target material for forming a conductive complex oxide film of the general formula $ABO_3$ and includes an oxide of an element A (first element), an oxide of an element B (second element), an oxide of an element X (third element), and at least one of an Si compound and a Ge compound.

Specifically, at least the element A, the element B, and the element X are included in the insulating target material according to this embodiment as oxides.

The element A may be at least one element selected from La, Ca, Sr, Mn, Ba, and Re. The element B may be at least one element selected from Ti, V, Sr, Cr, Fe, Co, Ni, Cu, Ru, Ir, Pb, and Nd. The element X may be at least one element selected from Nb, Ta, and V.

A uniform insulating target material which exhibits excellent insulating properties can be obtained by incorporating at least one of the Si compound and the Ge compound into the insulating target material according to this embodiment, as is clear from the examples described later. It is preferable that the insulating target material comprise at least the Si compound of the Si compound and the Ge compound. It is preferable that the Si compound and the Ge compound be oxides.

According to this embodiment, an oxygen deficiency in the resulting conductive complex oxide film can be compensated for by incorporating the oxide of the element X (at least one element selected from Nb, Ta, and V) into the insulating target material. This ensures that a conductive complex oxide film exhibiting excellent crystallinity and morphology can be obtained even when high-temperature heat treatment is performed during film formation using the insulating target material.

The oxide of the element A and the oxide of the element B may be included in the insulating target material according to this embodiment in the same ratio as the stoichiometric composition of the resulting conductive complex oxide (general formula $ABO_3$), that is, in a ratio of A:B=1:1 or a ratio close thereto. The ratio of the elements of the insulating target material is set taking the vaporization properties of the elements and the like into consideration. The insulating target material according to this embodiment preferably does not have a perovskite structure of the general formula $ABO_3$. When the insulating target material has such a perovskite structure, the resulting target exhibits conductivity. As a result, the target may not be suitably used, or cannot be used, as a RF sputtering target.

As examples of the conductive complex oxide film to which the insulating target material according to this embodiment may be applied, La(Sr)$CoO_3$ (the metal in the parentheses indicates a substituent metal; hereinafter the same) such as $LaCoO_3$, $SrCoO_3$, and $La_{1-x}Sr_xCoO_3$ (wherein x and y represent rational numbers between 0 and 1; hereinafter the same), La(Sr)$MnO_3$ such as $LaMnO_3$, $SrMnO_3$, and $La_{1-x}Sr_xMnO_3$, $LaNiO_3$, $SrNiO_3$, La(Sr)$NiO_3$, $CaCoO_3$, La(Sr)(Fe)$CoO_3$ such as La(Ca)$CoO_3$, $LaFeO_3$, $SrFeO_3$, La(Sr)$FeO_3$, and $La_{1-x}Sr_xCo_{1-y}Fe_yO_3$, $La_{1-x}Sr_xVO_3$, $La_{1-x}Ca_xFeO_3$, $LaBaO_3$, $LaMnO_3$, $LaCuO_3$, $LaTiO_3$, $BaCeO_3$, $BaTiO_3$, $BaSnO_3$, $BaPbO_3$, $BaPb_{1-x}O_3$, $CaCrO_3$, $CaVO_3$, $CaRuO_3$, $SrIrO_3$, $SrFeO_3$, $SrVO_3$, $SrRuO_3$, Sr(Pt)$RuO_3$, $SrTiO_3$, $SrReO_3$, $SrCeO_3$, $SrCrO_3$, $BaReO_3$, $BaPb_{1-x}Bi_xO_3$, $CaTiO_3$, $CaZrO_3$, $CaRuO_3$, $CaTi_{1-x}Al_xO_3$, and the like can be given.

2. Method Of Manufacturing Insulating Target Material

The above insulating target material may be formed using the following method. The above insulating target material is a target material for forming a conductive complex oxide film of the general formula $ABO_3$.

A manufacturing method according to one embodiment of the invention comprises heat-treating and pulverizing a mixture obtained by mixing an oxide of an element A, an oxide of an element B, and an oxide of an element X to obtain a first powder, mixing the first powder and a solution including at least one of an Si raw material and a Ge raw material and collecting the resulting powder to obtain a second powder, heat-treating and pulverizing the second powder to obtain a third powder, and heat-treating the third powder. The element A, the element B, and the element X are the same as described above.

Specifically, the manufacturing method according to this embodiment may comprise the steps shown in FIG. 1.

(1) Production of First Powder

A powder of an oxide of the element A, a powder of an oxide of the element B, and a powder of an oxide of the element X are mixed (step S1). The resulting mixed material is calcined at 900 to 1000° C. and pulverized to obtain a first powder (step S2). The resulting first powder includes the oxide of the element A, the oxide of the element B, and the oxide of the element X.

(2) Production of Second Powder

The first powder and a solution including at least one of an Si raw material and a Ge raw material (Si raw material and/or Ge raw material) are mixed (step S3). As the Si raw material or the Ge raw material, an alkoxide, an organic acid salt, an inorganic acid salt, or the like, which may be used as a precursor material for a sol-gel method or a metalorganic decomposition (MOD) method, may be used. As the solution, a solution prepared by dissolving the Si raw material and/or the Ge raw material in an organic solvent such as an alcohol may be used. The Si raw material and/or the Ge raw material may be included in the solution in an amount of 2 to 10 mol % of the conductive complex oxide of the general formula $ABO_3$.

The Si raw material and the Ge raw material are preferably liquid at room temperature or soluble in a solvent. As examples of the compound which may be used, an organic salt, an alkoxide, an inorganic salt, and the like can be given. As specific examples of the organic salt, a formate, acetate, propionate, butyrate, octylate, stearate, and the like of Si and Ge can be given. As specific examples of the alkoxide, an ethoxide, propoxide, butoxide, and the like of Si and Ge can be given. The alkoxide may be a mixed alkoxide. As specific examples of the inorganic salt, a hydroxide, chloride, fluoride, and the like of Si and Ge can be given. These compounds may be directly used when liquid at room temperature, or may be used after dissolving the compound in another solvent. The Si raw material and the Ge raw material are not limited to these compounds. A number of Si salts and Ge salts may also be suitably used.

The powder and the solution are then separated by filtration or the like to obtain a second powder (step S4). The resulting second powder was obtained by mixing the first powder and the above solution.

(3) Production of Third Powder

The second powder is calcined at 900 to 1000° C. and pulverized to obtain a third powder (step S5). The resulting third powder includes the oxide of the element A, the oxide of the element B, the oxide of the element X, and the oxides of the Si raw material and the Ge raw material.

(4) Sintering

The third powder is sintered using a known method (step S6). For example, the third powder may be placed in a die and sintered by vacuum hot pressing. The third powder may be sintered at 1000 to 1500° C. The insulating target material according to this embodiment may be thus obtained. The resulting insulating target material is an oxide comprising the element A, the element B, the element X, and Si and/or Ge.

(5) Grinding

The surface of the resulting insulating target material may be ground by wet grinding, as required.

An insulating target material which is uniform and exhibits excellent insulating properties can be obtained by the manufacturing method according to this embodiment due to inclusion of the step of mixing the first powder and the solution of the Si raw material and/or the Ge raw material, as is clear from the examples described later. According to this manufacturing method, an insulating target material can be obtained which produces a conductive complex oxide film exhibiting a highly controlled crystal orientation and an excellent surface morphology. Since the oxide of the element X is used as the raw material for the first powder, a conductive complex oxide film exhibiting excellent crystallinity and morphology can be obtained even if high-temperature heat treatment is performed when forming a film using the insulating target material.

3. Conductive Complex Oxide Film

A conductive complex oxide film of the general formula $ABO_3$ may be obtained by RF sputtering using the above insulating target material. The conductive complex oxide film comprises at least one of Si and Ge, and preferably at least Si. The conductive complex oxide film of the general formula $ABO_3$ may comprise at least one of Si and Ge in an amount of 0.001 to 5 mol %, and preferably 0.001 to 1 mol %. The conductive complex oxide film comprises the element X (at least one of Nb, Ta, and V, and preferably Nb). Specific examples of the conductive complex oxide film of the general formula $ABO_3$ according to this embodiment have been described above. Therefore, further description is omitted.

In RF sputtering, argon and oxygen may be used as the sputtering gas. In this embodiment, an excellent conductive complex oxide film may be obtained in an atmosphere which contains only argon and does not contain oxygen.

The conductive complex oxide film according to this embodiment exhibits an excellent crystal orientation and an excellent surface morphology. For example, it was confirmed that a (100)-oriented $LaNiO_3$ film can be obtained by RF sputtering when using oxides of La, Ni, Nb, and Si as the raw materials for the insulating target material.

4. Examples

An example according to the invention and a comparative example are described below. Note that the invention is not limited to the following examples.

Example 1 and Comparative Example 1

An insulating target according to Example 1 was formed using the following method.

A first powder was produced. In more detail, a lanthanum oxide powder, a nickel oxide powder, and a niobium oxide powder were mixed. Niobium oxide was used in an amount of 5 wt % for the total amount of lanthanum oxide and nickel oxide. The resulting mixed material was calcined at 900 to 1000° C. and then pulverized to obtain a first powder.

A second powder was then produced. Specifically, the first powder and a silicon alkoxide solution were mixed. The silicon alkoxide solution was prepared by dissolving a silicon alkoxide in an alcohol at a concentration of 5 mol %.

The powder and the solution were then separated by filtration to obtain a second powder. The resulting second powder was obtained by mixing the first powder and the above solution.

The second powder was calcined at 900 to 1000° C. and then pulverized to obtain a third powder.

The third powder was sintered using a known method. In more detail, the third powder was placed in a die and sintered by vacuum hot pressing. The third powder was sintered at 1400° C. A target sample 1 of Example 1 was thus obtained.

A conductive complex oxide ($LaNiO_3$—$Nb_2O_5$—$SiO_2$) film (hereinafter called "LNNSO film") with a thickness of 80 nm was formed on a base by RF sputtering using the resulting target sample 1. As the base, a base formed by stacking a $ZrO_2$ film, a $TiO_X$ film, and a Pt film on a silicon substrate in that order was used. The RF sputtering was performed at a base temperature of 400° C., a power of 1400 W, a base-target distance of 70 mm, and a gas ratio of $Ar/O_2$=80/20.

Figure 2:
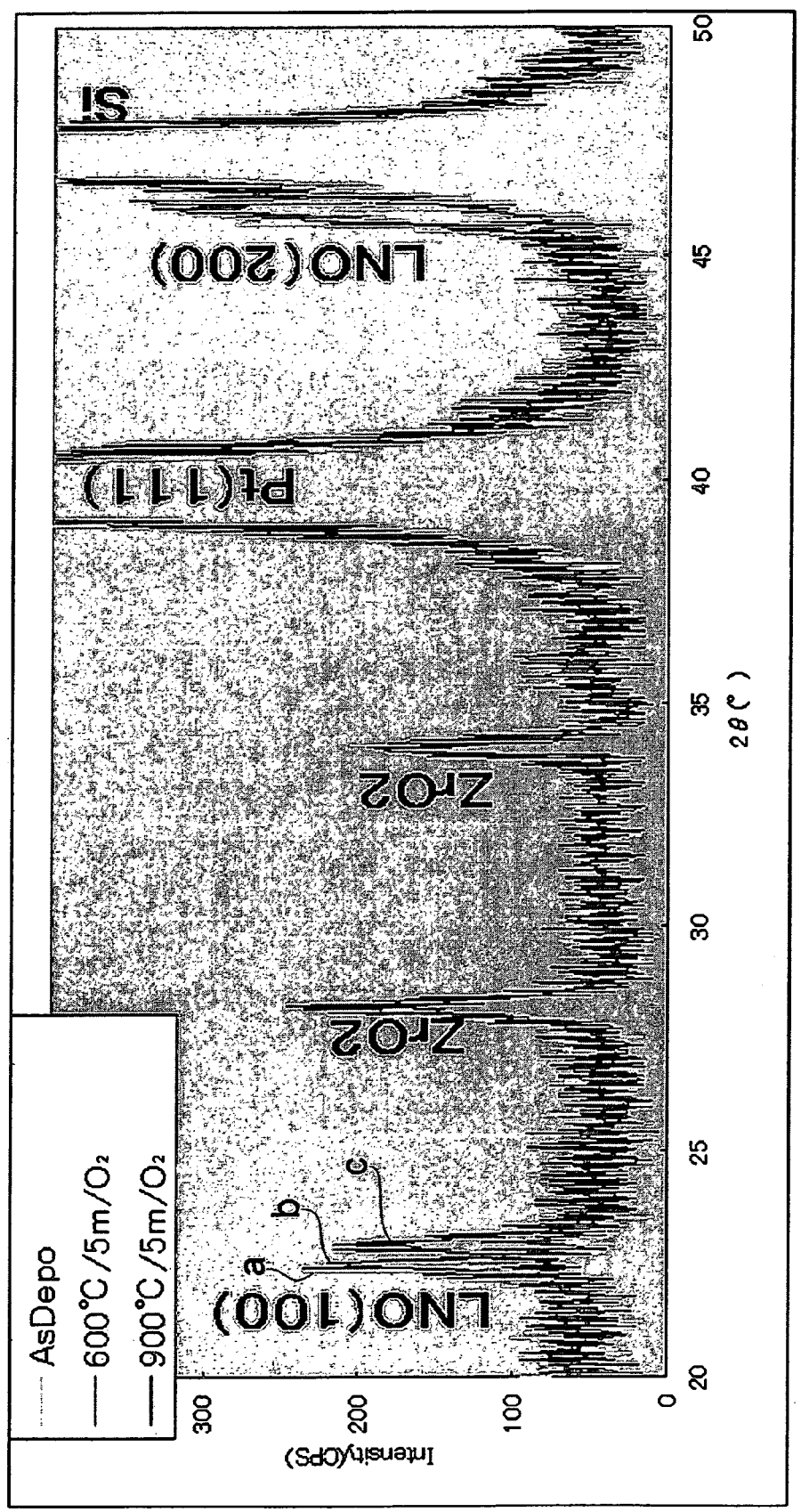
FIG. 2 is a graph showing X-ray analysis results of at conductive complex oxide film of Example 1.
Figure 3:
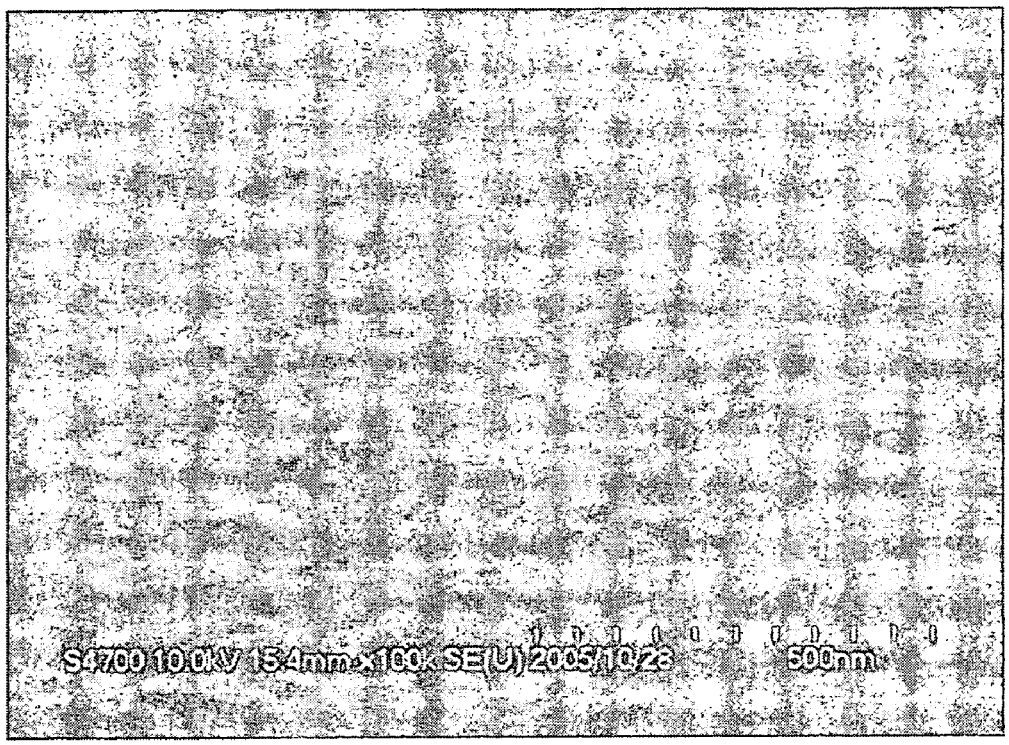
FIG. 3 is a view of a conductive complex oxide film of Example 1 observed by using an SEM.

The LNNSO film was subjected to X-ray analysis and SEM observation. The results are shown in FIG. 2. FIG. 2 shows the results of a sample a (As Depo) immediately after forming the LNNSO film, a sample b obtained by annealing the LNNSO film at 600° C. in an oxygen atmosphere, and a sample c obtained by annealing the LNSO film at 900° C. in an oxygen atmosphere. FIG. 3 shows an SEM image of the surface of the sample c.

The following matters were confirmed from FIGS. 2 and 3. As shown in FIG. 2, the LNNSO film of Example 1 was (100)-oriented, and its peak was shifted to a higher 2theta side due to annealing. As is clear from the SEM image, it was confirmed that the annealed LNNSO films exhibited an excellent surface morphology.

Comparative Example 1 is described below. In Comparative Example 1, a target sample 2 was obtained in the same manner as in Example 1 except that the first powder did not include niobium oxide and the step of forming the second powder by mixing the first powder and the solution was omitted. Specifically, the target sample 2 of Comparative Example 1 was obtained by directly sintering the first powder (mixture of lanthanum oxide and nickel oxide).

Figure 4:
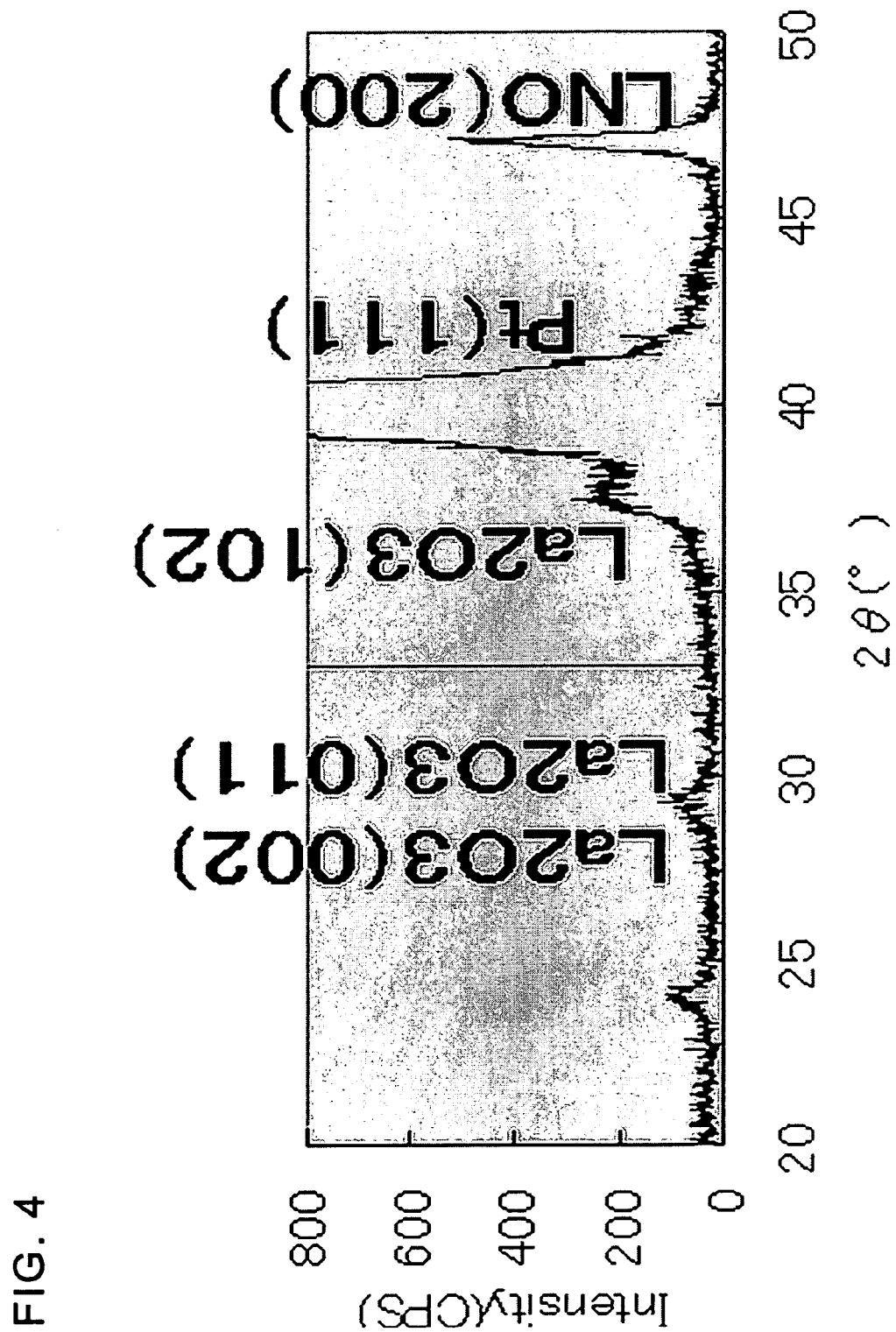
FIG. 4 is a graph showing X-ray analysis results of a conductive complex oxide film of Comparative Example 1.
Figure 5:
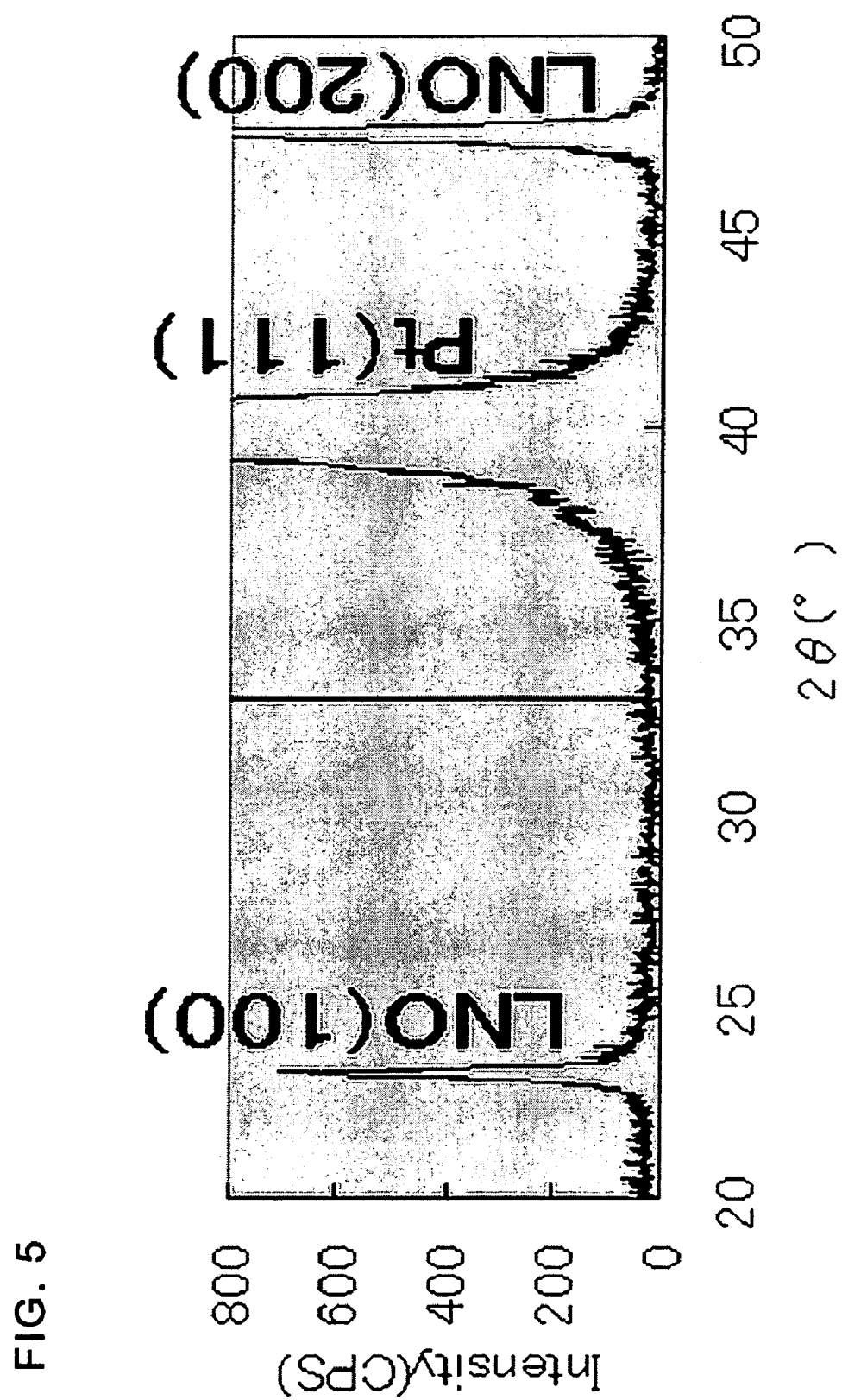
FIG. 5 is a graph showing X-ray analysis results of a conductive complex oxide film of Comparative Example 1.
Figure 6:
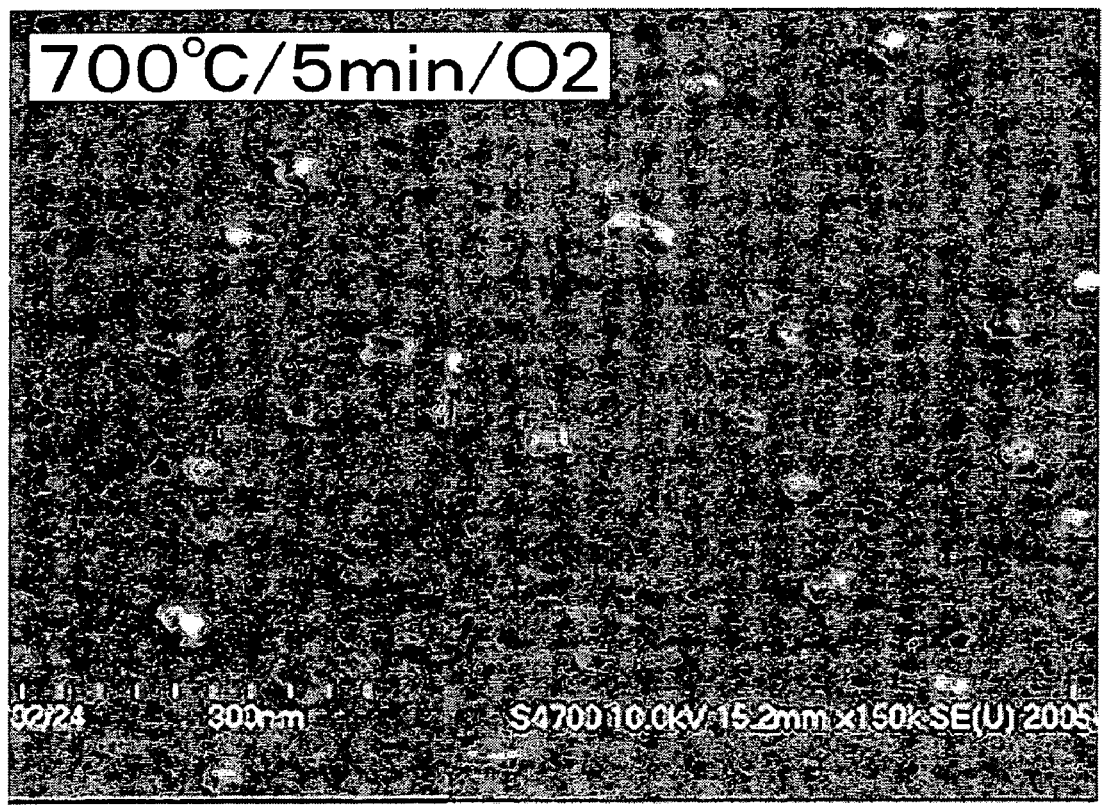
FIG. 6 is a view of a conductive complex oxide film of Comparative Example 1 observed by using an SEM.
Figure 7:
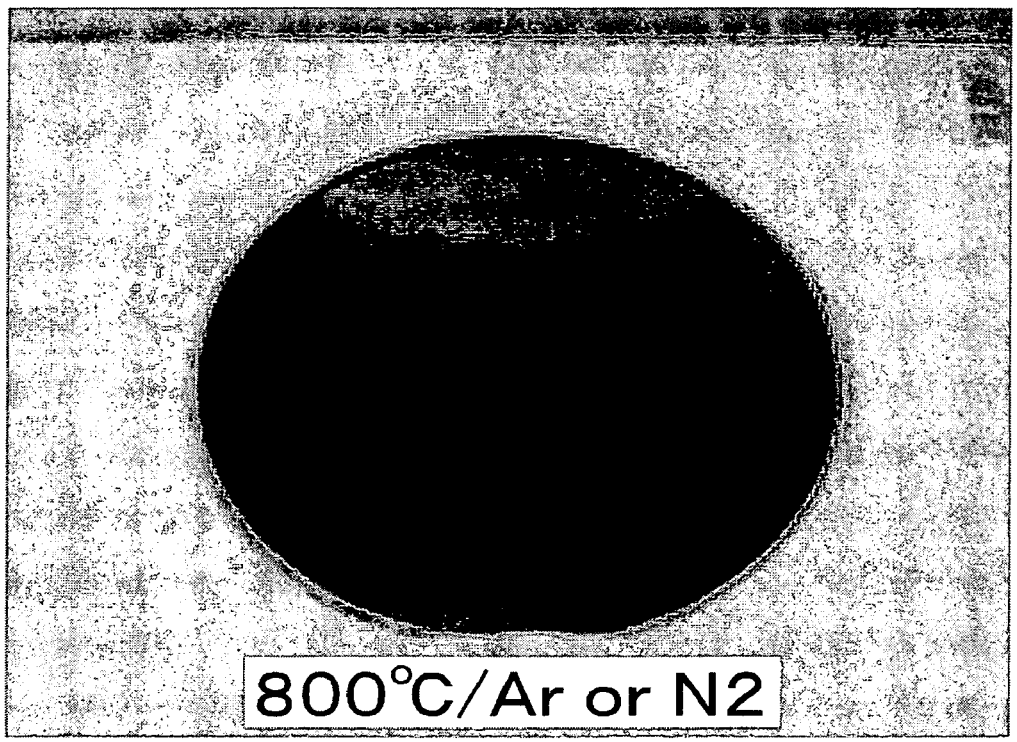
FIG. 7 is a photograph showing the outward appearance of a conductive complex oxide film of Comparative Example 1.

In Comparative Example 1, a conductive complex oxide ($LaNiO_3$) film (hereinafter called "LNO film") was obtained in the same manner as in Example 1 except for using the target sample 2. The LNO film was subjected to X-ray analysis, SEM observation, and outward appearance observation in the same manner as in Example 1. The results are shown in FIGS. 4 to 7. FIGS. 4 and 5 show the X-ray diffraction patterns of the LNO film. FIG. 4 is the pattern of part of the annealed LNO film, and FIG. 5 is the pattern of another part of the LNO film. FIG. 6 shows an SEM image of the LNO film annealed in an oxygen atmosphere, and FIG. 7 shows a photograph of the outward appearance of the LNO film.

The following matters were confirmed from FIGS. 4 to 7. As shown in FIG. 7, it was confirmed that the LNO film of Comparative Example 1 had a nonuniform surface outward appearance, that is, the color of the surface differs between the upper portion and the lower portion of the photograph. FIG. 4 shows the X-ray pattern of the LNO film in the upper portion of the outward appearance photograph, and FIG. 5 shows the X-ray pattern of the LNO film in the lower portion of the outward appearance photograph. As shown in FIGS. 4 and 5, it was confirmed that the LNO film was (100)-oriented in the lower portion of the outward appearance photograph but was (100)-oriented to only a small extent in the upper portion of the outward appearance photograph. It was confirmed that the LNO film of Comparative Example 1 exhibited a nonuniform crystallinity As is clear from the SEM image, it was confirmed that the annealed LNO film exhibited a poor surface morphology.

From the above results, it was confirmed that an insulating LNNSO target material which does not contain cracks and exhibits excellent uniformity can be obtained according to the example of the invention. It was also confirmed that the conductive LNNSO film formed using the insulating LNNSO target material exhibits excellent properties, specifically, an excellent crystal orientation, surface morphology, and uniformity.

5. Device

A device according to one embodiment of the invention includes a base and the above conductive complex oxide film formed above the base. The device according to this embodiment includes a part including the above conductive complex oxide and an electronic instrument including the part. Examples of the device according to this embodiment are given below. The above insulating target material may be applied to form a conductive complex oxide film used for various devices which are not limited to the devices given below.

5.1. Semiconductor Device

A semiconductor device including the above conductive complex oxide film is described below. This embodiment illustrates an example of a ferroelectric memory device including a ferroelectric capacitor which is an example of the semiconductor device.

Figure 8A:
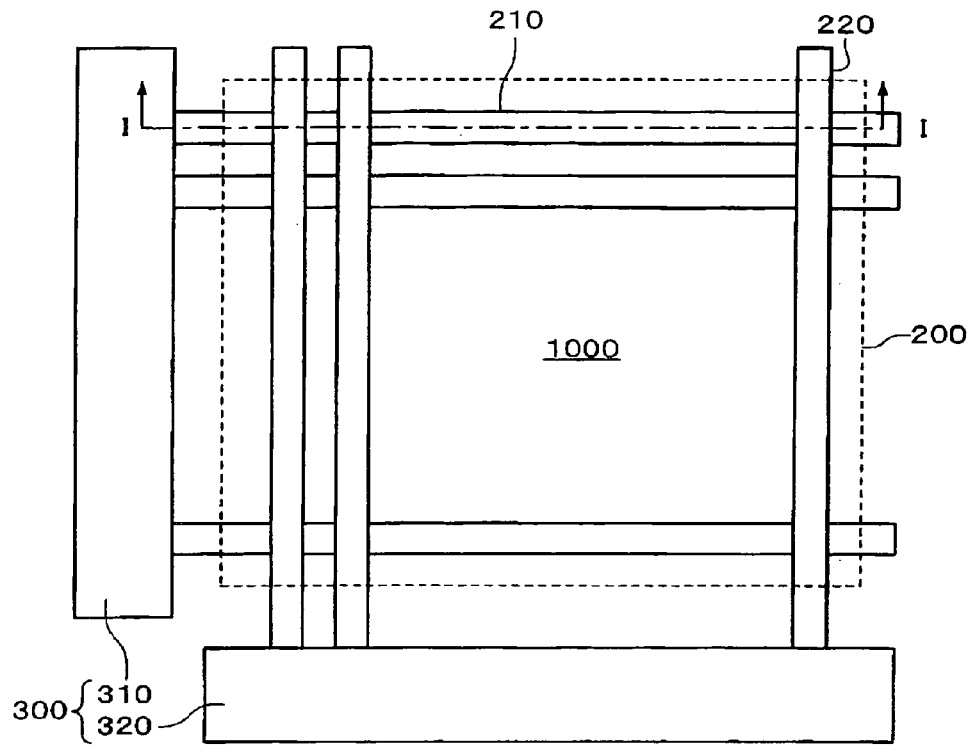
FIGS. 8A and 8B show a semiconductor device according to one embodiment of the invention.
Figure 8B:
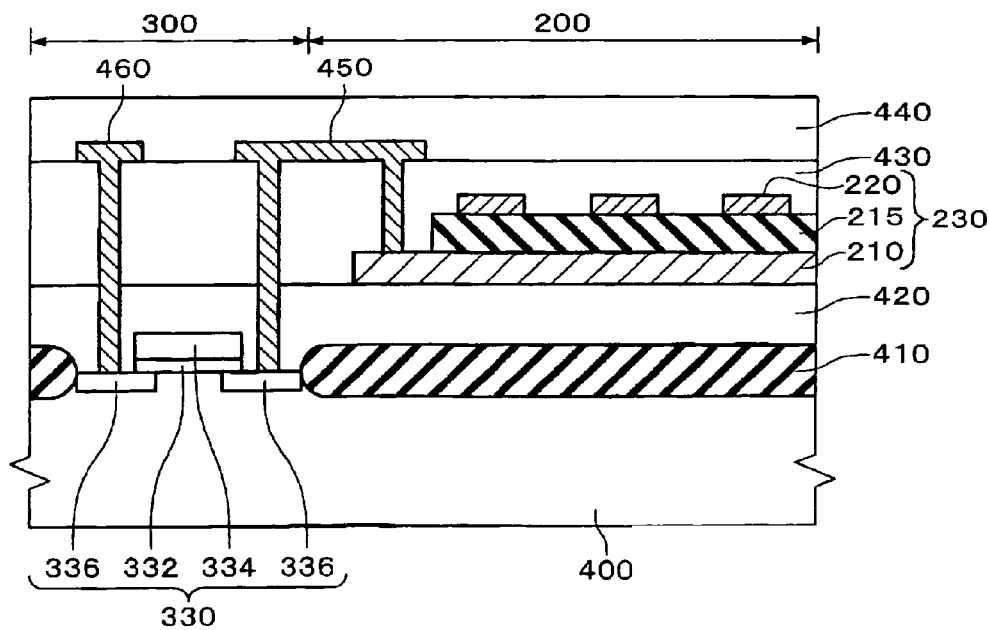

FIGS. 8A and 8B schematically show a ferroelectric memory device 1000 using the above conductive complex oxide film as an electrode. FIG. 8A shows the planar shape of the ferroelectric memory device 1000, and FIG. 8B shows a section taken along the line I-I in FIG. 8A.

As shown in FIG. 8A, the ferroelectric memory device 1000 includes a memory cell array 200 and a peripheral circuit section 300. In the memory cell array 200, row-selection lower electrodes 210 (wordlines) and column-selection upper electrodes 220 (bitlines) are arranged to intersect. The lower electrodes 210 and the upper electrodes 220 are formed in the shape of stripes of linear signal electrodes. The signal electrodes may be formed so that the lower electrode 210 serves as the bitline and the upper electrode 220 serves as the wordline. The peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 8B, a ferroelectric film 215 is disposed between the lower electrodes 210 and the upper electrodes 220. In the memory cell array 200, a memory cell which functions as a ferroelectric capacitor 230 is formed in the region in which the lower electrode 210 intersects the upper electrode 220. At least one of the lower electrode 210 and the upper electrode 220 is a film formed using the above conductive complex oxide film. The lower electrode 210 and the upper electrode 220 may be single layers of the above conductive complex oxide film, or may have a stacked structure formed of the conductive complex oxide film and another conductive film. A known barrier film may be formed between a first interlayer dielectric 420 and the lower electrode 210. The ferroelectric film 215 may be disposed between the lower electrode 210 and the upper electrode 220 at least in the region in which the lower electrode 210 intersects the upper electrode 220.

As shown in FIG. 8B, the peripheral circuit section 300 includes a MOS transistor 330 formed on a semiconductor substrate 400. The MOS transistor 330 includes a gate insulating film 332, a gate electrode 334, and source/drain regions 336. The MOS transistors 330 are isolated by means of an element isolation region 410. The first interlayer dielectric 420 is formed on the semiconductor substrate 400 on which the MOS transistor 330 is formed. The peripheral circuit section 300 is electrically connected with the memory cell array 200 through an interconnect layer 51. A second interlayer dielectric 430 and an insulating protective layer 440 are formed in the ferroelectric memory device 1000.

Figure 9:
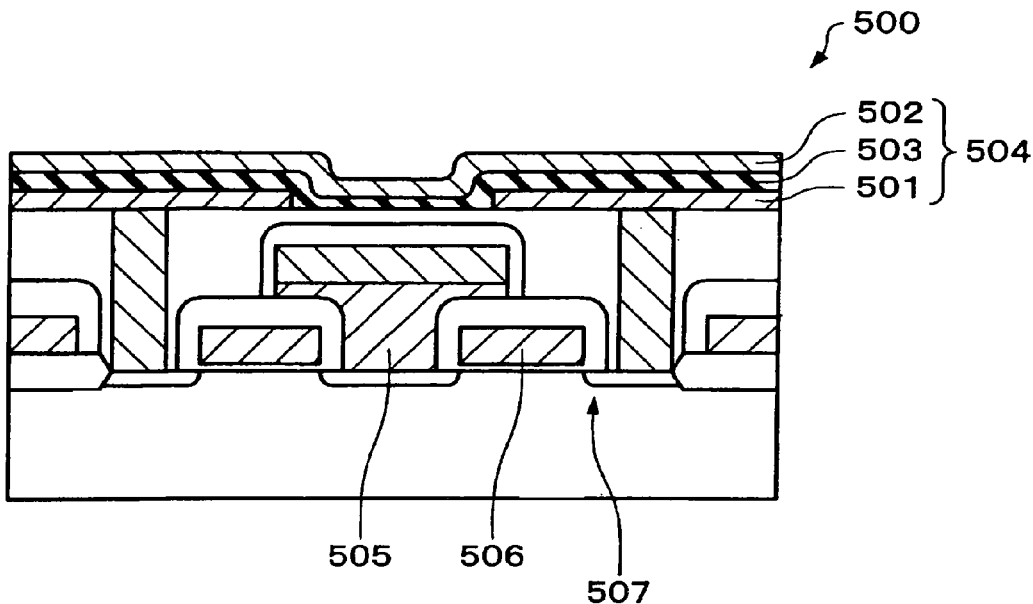
FIG. 9 is a sectional view schematically showing a 1T1C ferroelectric memory according to one embodiment of the invention.
Figure 10:
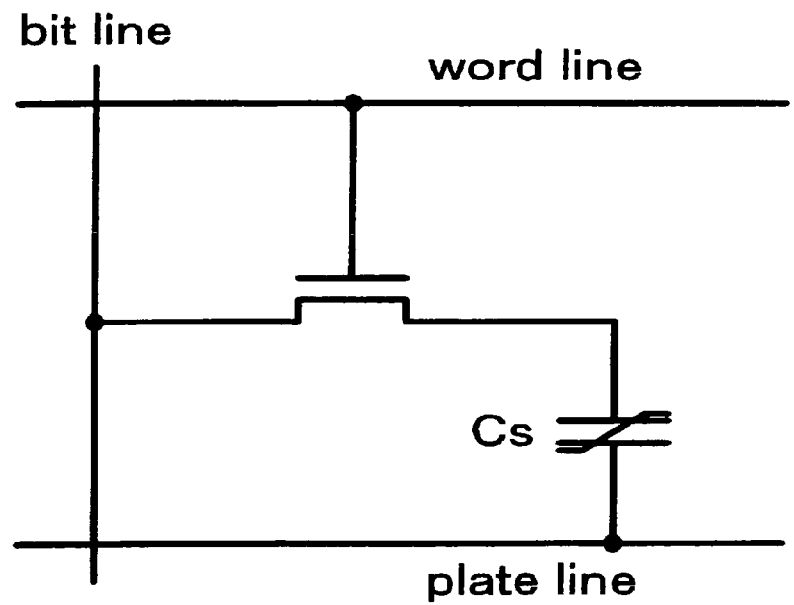
FIG. 10 is an equivalent circuit diagram of the ferroelectric memory shown in FIG. 9.

FIG. 9 shows a 1T1C ferroelectric memory device 500 as another example of the semiconductor device. FIG. 10 is an equivalent circuit diagram of the ferroelectric memory device 500.

As shown in FIG. 9, the ferroelectric memory device 500 is a memory device having a structure similar to that of a DRAM and includes a capacitor 504 (1C) including a lower electrode 501, an upper electrode 502 connected with a plate line, and a ferroelectric film 503 according to the above-described embodiment, and a switch transistor element 507 (1T) including source/drain electrodes, one of which is connected with a data line 505, and a gate electrode 506 connected with a wordline. In this example, at least either the lower electrode 501 or the upper electrode 502 is a film formed using the above conductive complex oxide film in the same manner as in the example shown in FIGS. 8A and 8B. In the 1T1C memory, data can be written and read at a speed as high as 100 ns or less, and the written data does not volatilize. Therefore, the 1T1C memory is a promising memory which may replace an SRAM or the like.

The semiconductor device according to this embodiment is not limited to the above-described semiconductor devices, and may also be applied to a 2T2C ferroelectric memory device and the like.

5.2. Piezoelectric Device

An example of applying the above conductive complex oxide film to a piezoelectric device is described below.

Figure 11:
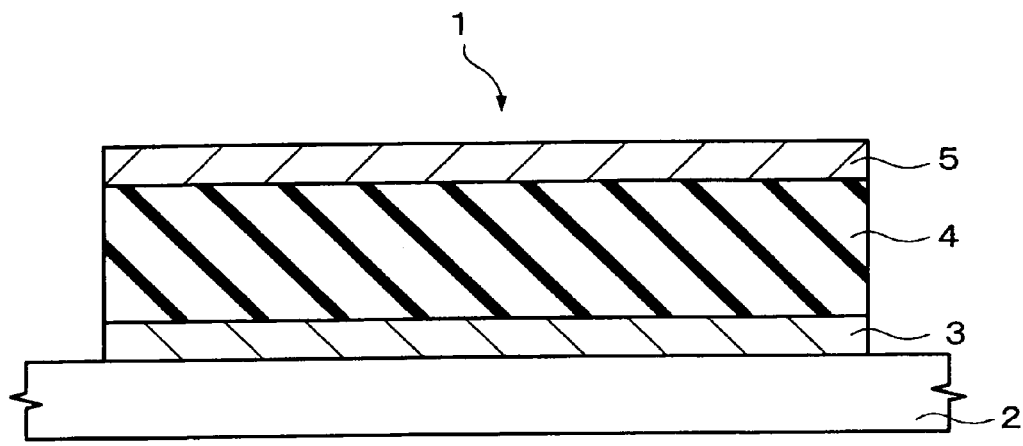
FIG. 11 is a sectional view schematically showing a piezoelectric device according to one embodiment of the invention.

FIG. 11 is a sectional view showing a piezoelectric device 1 including the above conductive complex oxide film. The piezoelectric device 1 includes a substrate 2, a lower electrode 3 formed on the substrate 2, a piezoelectric film 4 formed on the lower electrode 3, and an upper electrode 5 formed on the piezoelectric film 4. At least either the lower electrode 3 or the upper electrode 5 is a film formed using the above conductive complex oxide film. The lower electrode 3 and the upper electrode 5 may be single layers of the above conductive complex oxide film, or may have a stacked structure formed of the conductive complex oxide film and another conductive film.

The substrate 2 may have various forms depending on the application of the piezoelectric device. The substrate 2 may be formed of a single layer or a laminate including a plurality of layers. For example, when using the piezoelectric device 1 for an inkjet recording head described later, a substrate in which a (110)-oriented single crystal silicon substrate, a thermal oxide film formed on the surface of the single crystal silicon substrate, and an elastic plate are stacked may be used. In this case, the silicon substrate of the substrate 2 is processed to form ink cavities 521 in an inkjet recording head 50 as described later (see FIG. 12).

5.3. Inkjet Recording Head

Figure 12:
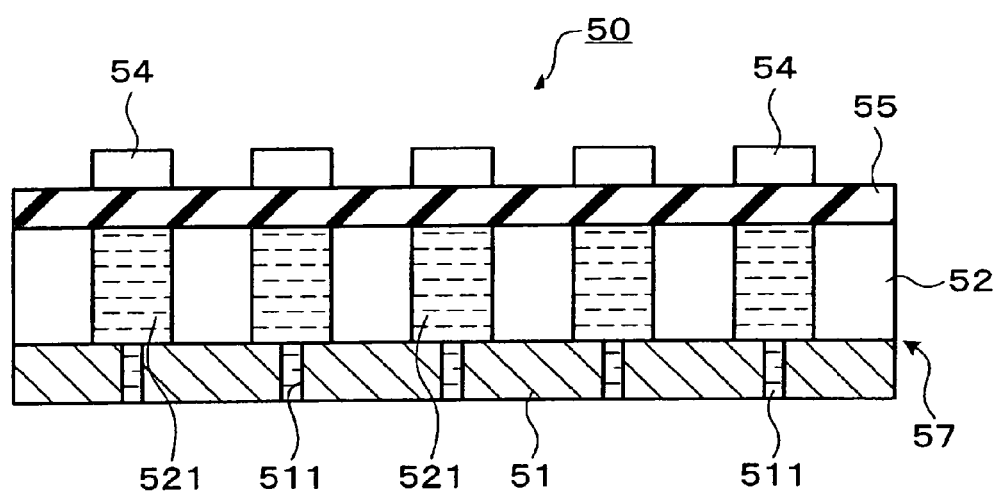
FIG. 12 is a schematic structural view of an inkjet recording head according to one embodiment of the invention.

An inkjet recording head in which the above piezoelectric device functions as a piezoelectric actuator is described below. FIG. 12 is a side sectional view showing a schematic configuration of an inkjet recording head according to one embodiment of the invention, and FIG. 13 is an exploded perspective view of the inkjet recording head which is reversed in the vertical direction.

Figure 13:
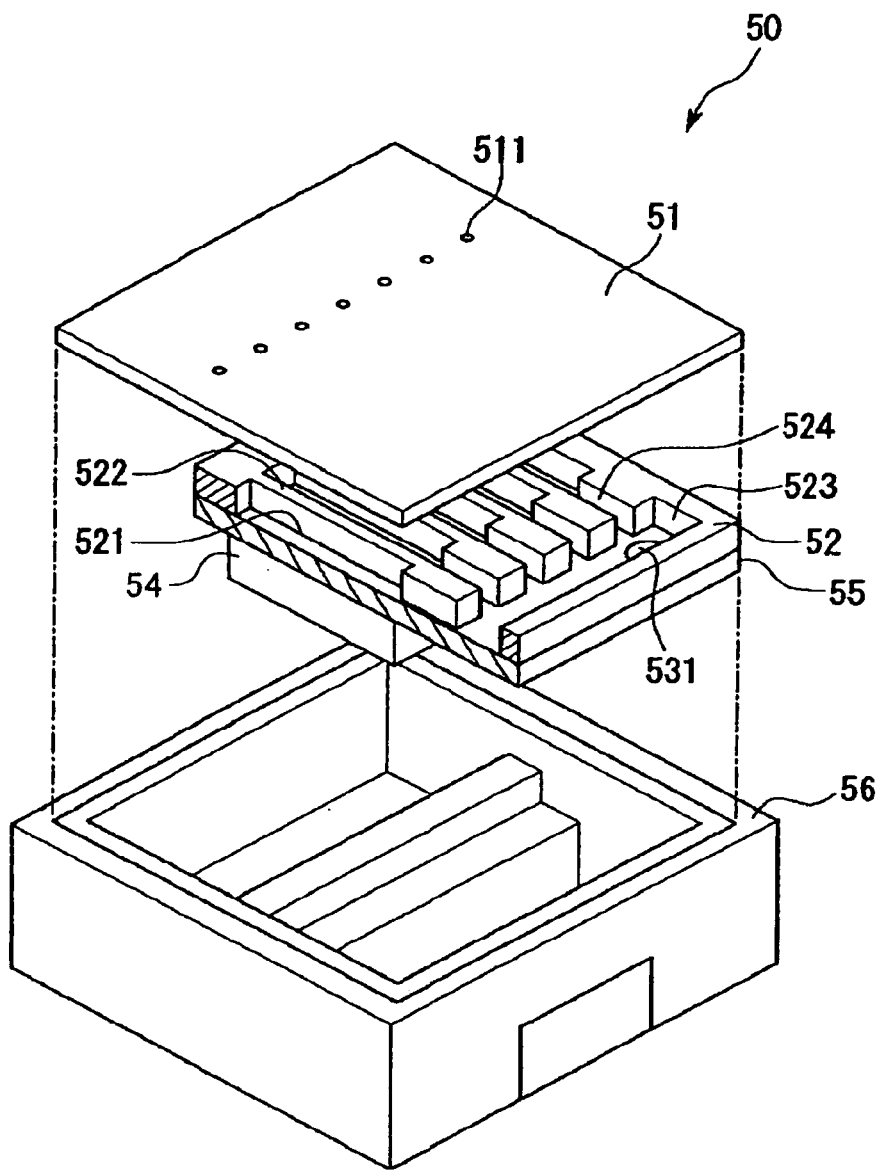
FIG. 13 is an exploded perspective view of an inkjet recording head according to one embodiment of the invention.

As shown in FIGS. 12 and 13, the inkjet recording head 50 includes a head body (base) 57 and a piezoelectric section 54 formed over the head body 57. The piezoelectric device 1 shown in FIG. 11 is provided in the piezoelectric section 54. The piezoelectric device 1 is formed by stacking the lower electrode 3, the piezoelectric film (ferroelectric film) 4, and the upper electrode 5 in that order. In the inkjet recording head, the piezoelectric section 54 functions as a piezoelectric actuator.

The head body (base) 57 includes a nozzle plate 51, an ink chamber substrate 52, and an elastic film 55. These members are accommodated in a housing 56 to form the inkjet recording head 50.

The piezoelectric section is electrically connected with a piezoelectric device driver circuit (not shown) and is actuated (vibrates or is deformed) based on a signal from the piezoelectric device driver circuit. Specifically, each piezoelectric section 54 functions as a vibration source (head actuator). The elastic film 55 vibrates due to vibration (deflection) of the piezoelectric section 54, and functions to momentarily increase the pressure inside the cavity 521.

An example of the inkjet recording head which discharges ink has been described above. Note that this embodiment aims at a liquid jetting head using a piezoelectric device and a liquid jetting device in general. As the liquid jetting head, a recording head used for an image recording device such as a printer, a color material jetting head used to produce a color filter for a liquid crystal display or the like, an electrode material jetting head used to form an electrode for an organic EL display, a field emission display (FED), or the like, a bio-organic substance jetting head used to produce a bio-chip, and the like can be given.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

What is claimed is:

1. A method of manufacturing an insulating target comprising:

obtaining a first powder by heat treating and pulverizing a mixture obtained by mixing an oxide of an element A, an oxide of an element B, and an oxide of an element X, A being at lease one element selected from a first group consisting of La, Ca, Sr, Mn, Ba, and Re, B being at least one element selected from a second group consisting of Ti, V, Sr, Cr, Fe, Co, Ni, Cu, Ru, Ir, Pb, and Nd, X being at least one element selected from a third group consisting of Nb, Ta, and V;

mixing the first powder and a solution including at least one of an Si raw material and a Ge raw material;

obtaining a second powder from the mixture of the first powder and the solution;

obtaining a third powder by heat treating and pulverizing the second powder; and obtaining the insulating target by heat treating the third powder.

2. The method of manufacturing an insulating target material as defined in claim 1, wherein the solution includes at least one of the Si raw material and the Ge raw material in an amount of 2 to 10 mol %.

3. The method of manufacturing an insulating target material as defined in claim 1, wherein the heat treatment of the mixture is performed at 900 to 1000° C.

4. The method of manufacturing an insulating target material as defined in claim 1, wherein the heat treatment of the second powder is performed at 900 to 1000° C.

5. The method of manufacturing an insulating target material as defined in claim 1, wherein the heat treatment of the third powder is performed at 1000 to 1500° C.

* * * * *